United States Patent [19]

Umetsu et al.

[11] Patent Number: 5,079,559

[45] Date of Patent: Jan. 7, 1992

[54] DUAL PLATE ANTENNA

[75] Inventors: Shinjiro Umetsu; Masahiro Matai; Seiji Nishikawa, all of Tokyo, Japan

[73] Assignees: NEC Corporation; Nippon Telegraph and Telephone Corporation, both of Japan

[21] Appl. No.: 425,741

[22] Filed: Oct. 23, 1989

[30] Foreign Application Priority Data

Oct. 26, 1988 [JP] Japan .................................. 63-268223

[51] Int. Cl.$^5$ .............................................. H01Q 1/24
[52] U.S. Cl. ................................... 343/702; 343/745; 455/347
[58] Field of Search ................ 343/700 MS, 702, 745, 343/846, 906; 361/394, 399, 424; 455/347, 348, 349, 351

[56]  References Cited

U.S. PATENT DOCUMENTS

| 4,599,680 | 7/1986 | Gibson et al. | 361/399 |
| 4,625,212 | 11/1986 | Oda et al. | 343/744 |
| 4,744,009 | 5/1988 | Grabbe et al. | 361/399 |
| 4,814,776 | 3/1989 | Caci et al. | 343/702 |
| 4,864,636 | 9/1989 | Brunius | 343/702 |
| 4,876,552 | 10/1989 | Zackman | 343/702 |
| 4,920,353 | 4/1990 | Mori et al. | 343/702 |
| 4,955,084 | 9/1990 | Umetsu et al. | 343/702 |

FOREIGN PATENT DOCUMENTS 7204   1/1985  Japan ................................... 343/702

Primary Examiner—Michael C. Wimer
Attorney, Agent, or Firm—Laff, Whitesel, Conte & Saret

[57]  ABSTRACT

Portable radio equipment which is thin enough to enhance portability and, yet, has a sufficiently high antenna gain. The equipment has an antenna which is made up of a pair of metal plates located face-to-face, and a short-circuiting member for short-circuiting the metal plates. A circuit board loaded with radio circuitry is interposed between two metal plates with the radio circuitry being connected to the antenna. A capacitor is connected between the metal plates to lower the resonance frequency of the antenna, as needed. A circular cell for powering the equipment is located in a cell receiving portion near the short-circuiting member.

7 Claims, 3 Drawing Sheets

DUAL PLATE ANTENNA

BACKGROUND OF THE INVENTION

The present invention relates to thin card-like portable radio equipment in which an antenna having a high gain is incorporated.

A predominant type of antenna built in portable radio equipment is a loop antenna which is capable of feeding electromagnetic energy around the equipment efficiently to circuitry. A loop antenna has one or more turns forming loops and transforms magnetic fluxes intersecting the loops into electric energy so as to feed it to the circuitry. Generally, a problem with a loop antenna is that as the aperture of the loop or loops decreases, the number of magnetic fluxes intersecting the aperature and, therefore, the antenna gain decreases. Nevertheless, in parallel with the current trend toward miniature portable radio equipment, there is an increasing demand for a miniature built-in loop antenna. In this situation, the antenna gain attainable with miniature radio equipment and, therefore, the communicatable range is limited.

SUMMARY OF THE INVENTION

It is therefore an object of the present invention to provide portable radio equipment which is thin enough to enhance portability and, yet, provided with a built-in antenna having a high antenna gain.

It is another object of the present invention to provide generally improved portable radio equipment.

Thin portable radio equipment of the present invention comprises an antenna comprising a first and a second flat antenna element located to face each other, and a short-circuiting member for short-circuiting the first and second antenna elements, and a circuit board located between the first and second antenna elements and loaded with radio circuitry which is connected to the antenna.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

Figure 1:
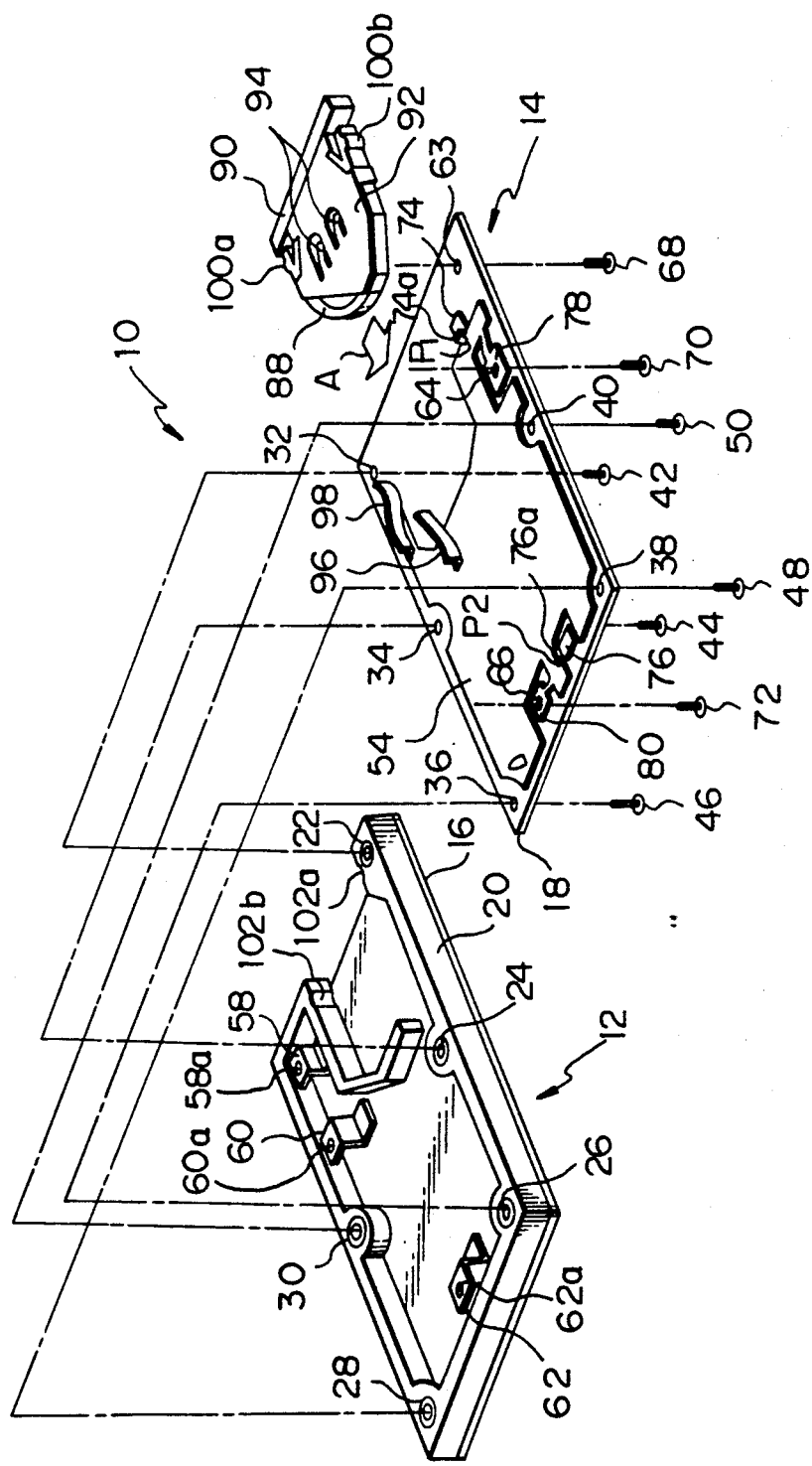
FIG. 1 is an exploded perspective view showing portable radio equipment embodying the present invention.
Figure 2A:
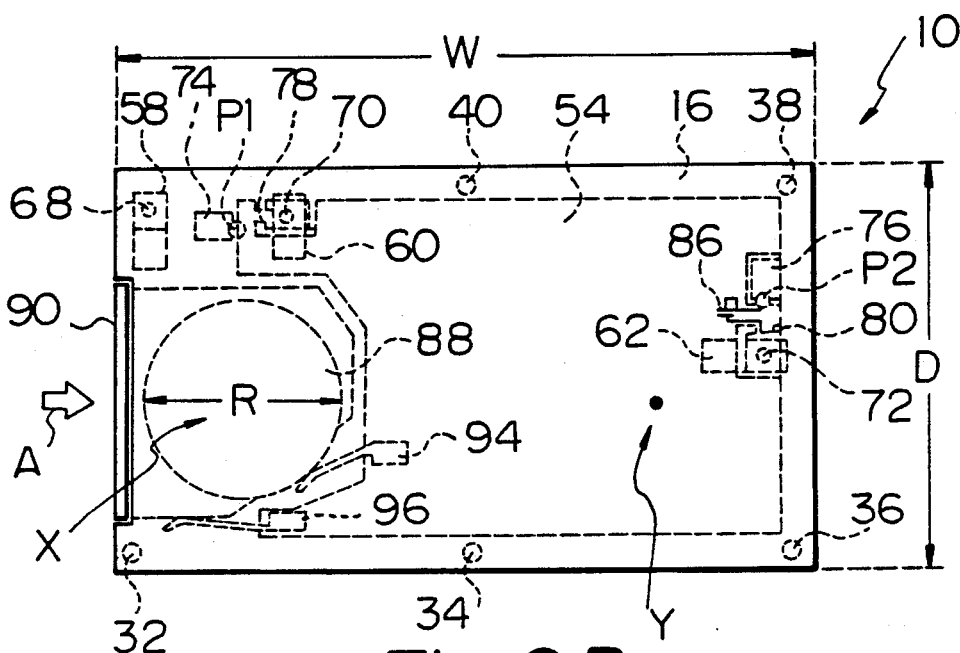
FIG. 2A is a plan view of the illustrative embodiment.
Figure 2B:
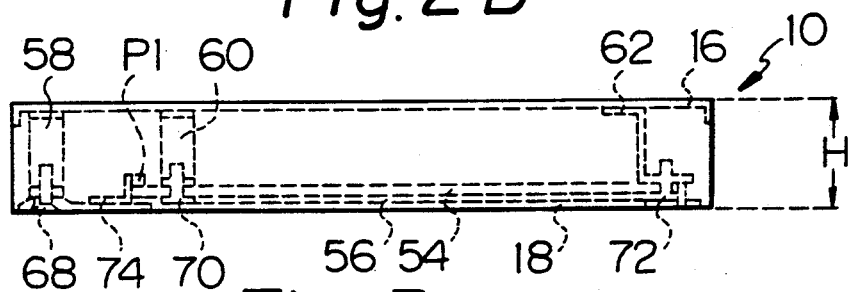
FIG. 2B is a front view of the illustrative embodiment.

Referring to FIG. 1 of the drawings, portable radio equipment embodying the present invention is shown and generally designated by the reference numeral 10. As shown, the equipment 10 has a first antenna assembly 12 and a second antenna assembly 14 which are implemented by a first antenna element 16 and a second antenna element 18, respectively. The antenna elements 16 and 18 are constituted by a flat metal plate each. A case 20 made of a plastic or similar insulative material is adhered to the edges of the first antenna element 16. Nuts 22, 24, 26, 28 and 30 are buried in the case 20. The second antenna element 18 is provided with holes 32, 34, 36, 38 and 40 which are associated with the nuts 22, 24, 26, 28 and 30, respectively. As shown in FIGS. 2A and 2B, the first and second antenna elements 16 and 18, i.e., the first and second antenna assemblies 12 and 14 are positioned face-to-face and then screws 42, 44, 46, 48 and 50 are driven into the aligned holes 32, 34, 36, 38, and 40 and nuts 22, 24, 26, 28 and 30 whereby the two assemblies 12 and 14 are firmly connected to each other.

Figure 3:
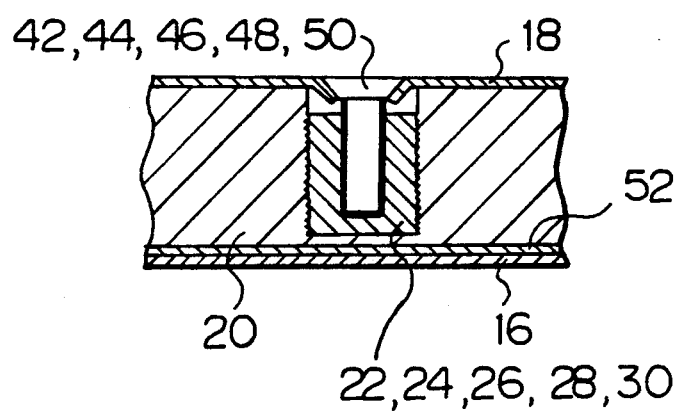
FIG. 3 is a fragmentary enlarged section showing a first and a second antenna element of the illustrative embodiment which are fastened together by screws.

As shown in FIG. 3 in an enlarged scale, none of the nuts 22, 24, 26, 28 and 30 extends throughout the case 20. This prevents the first and second antenna elements 16 and 18 from being short-circuited via the nuts 22 to 30. In FIG. 3, the reference numeral 52 designates a layer of adhesive adapted to fix the case 20 to the first antenna element 16.

As shown in FIGS. 1, 2A and 2B, a circuit board 54 carrying radio circuitry (not shown) thereon is mounted on the inner surface of the second antenna element 18 with the intermediary of an insulating film 56 (FIG. 2B). The insulating film 56 may be implemented as a sheet of polyester or similar insulating material. Connectors 58, 60 and 62 are rigidly mounted on the first antenna element 16 by spot welding or similar technology. Threaded holes 58a, 60a and 62a are respectively formed in the connectors 58, 60 and 62, while a hole 63 is formed through the second antenna element 18 and holes 64 and 66 are formed through the circuit board 54. Screws 68, 70 and 72 are driven into the threaded holes 58a, 60a and 62a through the aligned holes 63, 64 and 66, whereby the first antenna element 16 is electrically connected to the second antenna element 18 or the circuit board 54. More specifically, the first and second antenna elements 16 and 18 are electrically interconnected by the connector 58, while the first antenna element 16 and predetermined portions of the circuit board 54 are electrically interconnected by the connectors 60 and 62. In this manner, the antenna elements 16 and 18 and circuit board 54 can be assembled, disassembled and maintained with ease as needed, because their interconnection is implemented by screws 68, 70 and 72.

As shown in FIGS. 1, 2A and 2B, terminals 74 and 76 are affixed to the second antenna element 18 by spot welding, for example. Tips 74a and 76a of the terminals 74 and 76, respectively, are soldered or otherwise connected to predetermined portions P1 and P2 of the circuit board 54. The terminals 74 and 76, therefore, set up electrical connection between the second antenna element 18 and the circuit board 54. The circuit board 54 has two connecting portions 78 and 80.

Figure 4A:
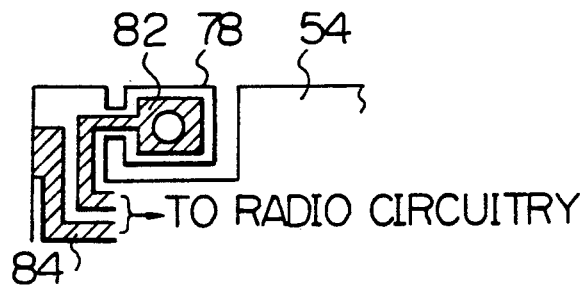
FIG. 4A is an enlarged plan view of a connecting portion of a circuit board included in the illustrative embodiment.
Figure 4B:
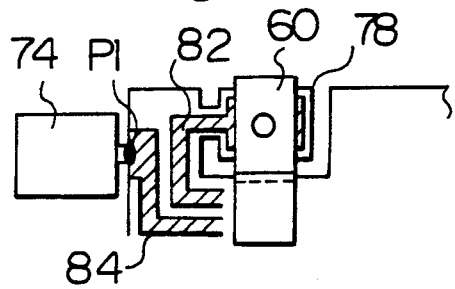
FIG. 4B is a plan view showing the circuit board and the antenna elements in an interconnected condition.
Figure 4C:
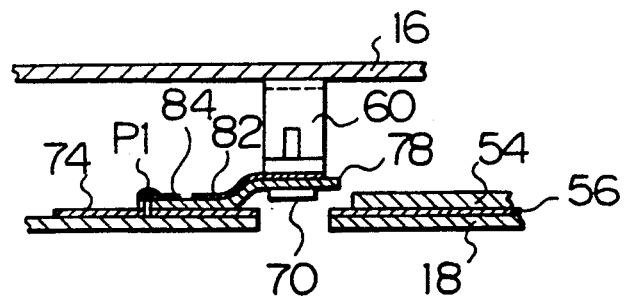
FIG. 4C is a sectional front elevation showing the interconnection in an enlarged scale.

Referring to FIGS. 4A to 4C, there are shown in an enlarged scale a portion where the antenna elements 16 and 18 and circuit board 54 are interconnected and the portion P1 of the circuit board 54. As shown, the connecting portion 78 is cut and raised in the form of a tongue from the circuit board 54 and is angularly movable about at least one side thereof. The connecting portion 78, therefore, is flexible enough to free the circuit board 54 from excessive stresses. Circuit patterns 82 and 84 formed of copper foil, for example, are printed on the circuit board 54 and connected to radio circuitry which is provided on the circuit board 54. The connecting portion 80, like the connecting portion 78, is formed in a tongue configuration.

As shown in FIG. 2A, a capacitor 86 is loaded between the portion P2 of the circuit board 54 and the connecting portion 80 (where the connected 62 is connected) as needed. The radio circuitry provided on the circuit board 54 is connected to between the portion P1 and the connecting portion 78 (where the connector 60 is connected).

Figure 5:
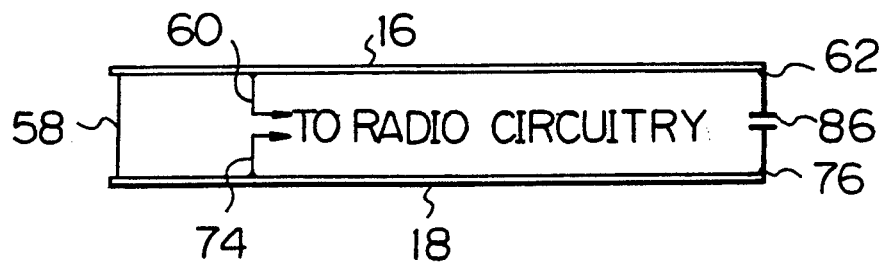
FIG. 5 is a schematic view of the antenna included in the equipment of FIG. 1.

FIG. 5 shows the antenna arrangement of the illustrative embodiment schematically. As shown, the antenna built in the radio equipment 10 has a so-called inverted F antenna configuration which is thin and, yet, high in antenna gain. If the dimensions of radio equipment are small for a given wavelength λ of an electromagnetic wave, the resonance frequency particular to an antenna of the equipment will increase. The capacitor 86 is loaded to lower the resonance frequency, as needed.

Referring to FIGS. 1 and 2A again, a nickel-cadmium cell, lithium cell or similar circular cell 88 is retained by a cell case 90 and a terminal plate 92. The terminal plate 92 has negative terminals or contacts in the form of tongues 94 which are individually engaged with positive electrodes of the cell 88. The outer periphery of the cell 88 serves as a positive electrode. Hence, when the cell 88 is inserted into the case 90 in a direction indicated by an arrow A, the periphery of the cell 88, i.e., the positive electrode and the terminal plate 92 which is connected to the negative terminal are respectively brought into connection with cell terminals 96 and 98 which are provided on the circuit board 54. The cell case 92 has a pair of stops 100a and 100b extending sideways from opposite edges thereof. The stops 100a and 100b mate respectively with recesses 102a and 102b which are formed in the case 20, thereby firmly maintaining the cell 88 in the equipment 10.

Since the first and second antenna elements 16 and 18 are short-circuited by the connector 58, and potential difference between the antenna elements 16 and 18 is small in the vicinity of the connector 58. Therefore, by locating the cell 88 in close proximity to the connector 58, it is possible to safeguard the antenna characteristics against critical influence of various kinds of scattering such as the scattering in the dimensions of the cell 88 and cell case 90 and the scattering in the position of the cell 88 relative to the equipment 10. For this reason, the radio equipment 10 is so configured as to accommodate the cell 88 in a position X, FIG. 2A, close to the connector 58 which short-circuits the antenna elements 16 and 18. Such a configuration will be described more specifically hereinafter.

Assume that the radio equipment 10 is designed for a 280 megahertz application, that as shown in FIGS. 2A and 2B it has a width W of 80 millimeters, a depth D of 50 millimeters, and a height H of 4.5 millimeters, and that the circular cell 88 has a diameter R of 23 millimeters and a thickness t of 2.8 millimeters. Experiments were conducted to determine the influence of the cell 88 on the antenna characteristics with respect to two difference positions of the cell 88, i.e., the position X close to the connector 58 and a position Y, FIG. 2A remote from the connector 58. The experiments showed that the loss resistance R (X) of the antenna associated with the position X and the loss resistance R (Y) associated with the position Y are 1.4 ohms and 1.8 ohms, respectively. Since antenna gain is inversely proportional to loss resistance, the results of experiments prove that the antenna gain is improved when the cell 88 is located in the position X than in the position Y by a degree $I = 10 \log R\ (Y)/R(X)$. Hence, $I = 10 \log R\ (Y)/R(X)$ $(Y)/R(X) = 10 \log 1.8/1.4 \approx 1$ (dB), meaning an improvement in antenna gain by about 1 (dB).

In summary, it will be seen that the present invention provides portable radio equipment which has a thin handy configuration and, yet, insures a sufficiently high antenna gain.

Various modifications will become possible for those skilled in the art after receiving the teachings of the present disclosure without departing from the scope thereof.

What is claimed is:

1. A thin portable radio equipment comprising:
   an antenna comprising first and second antenna elements located to face each other, each of said antenna elements comprising a flat metal plate, and short-circuiting means for short-circuiting said first and second antenna elements;
   an insulating film located on an inner surface of said second antenna element;
   a circuit board mounted on said insulating film for carrying radio circuitry thereon, said insulating film electrically insulating said circuit board and said inner surface from each other;
   said short-circuiting means comprising a first connector affixerd and electrically connected to said first antenna element and having a threaded hole, and a first screw mating with said threaded hole of said first connector through a hole of said second antenna element so that said first and second antenna elements are connected in a face-to-face position;
   first connecting means comprising a second connector affixed and electrically connected to said first antenna element and having a threaded hole, and a second screw mating with said threaded hole of said second connector and electrically connected to a conductive first connecting portion of said circuit board which is defined in a first predetermined position; and
   second connecting means for electrically connecting said second antenna element and said conductive first connecting portion of said circuit board.

2. Equipment as claimed in claim 1, wherein said second connecting means comprises:
   a first terminal electrically connected at one end to said second antenna element and soldered at the other end to said firt predetermined position of said circuit board; and
   a second terminal electrically connected at one end to said second antenna element and soldered at the other end to a second predetermined position of said circuit board.

3. Equipment as claimed in claim 2, further comprising third connecting means for electrically connecting said first antenna element and said circuit board.

4. Equipment as claimed in claim 3, wherein said third connecting means comprises:

- a third connector affixed to and electrically connected to said first antenna element and provided with a threaded hole; and
- a third screw mating with said threaded hole of said third connector and electrically connected to a second connecting portion of said circuit board which is defined near said second predetermined position.

5. Equipment as claimed in claim 4, wherein said first and second connecting portions of said circuit board are each cut and raised from said circuit board in a tongue configuration and is angularly movable about at least one side.

6. Equipment as claimed in claim 4, further comprising a capacitor inserted between the second terminal and the third connector to thereby lower the resonance frequency of said antenna.

7. A thin portable radio equipment comprising:

- first and second metal plates located to face each other, constituting first and second antenna elements, respectively;
- short-circuiting means for short-circuiting said first and second metal plates;
- a circuit board located between said first and second metal plates for mounting thereon radio circuitry which is connected to said first and second antenna elements;
- a cell for powering said equipment; and
- a cell receiving portion located between said first and second metal plates for accommodating said cell, said cell receiving portion being positioned closer to the short-circuiting point of said first and second metal plates than edges of said first and second metal plates which edges are farthest from said short-circuiting point, thereby reducing a loss resistance of said antenna which is caused by accommodating said cell in said cell receiving portion.

* * * * *